United States Patent
Chang et al.

(10) Patent No.: US 10,147,729 B2
(45) Date of Patent: Dec. 4, 2018

(54) STRUCTURES, DEVICES AND METHODS FOR MEMORY DEVICES

(71) Applicant: Taiwan Semiconductor Manufacturing Company Limited, Hsinchu (TW)

(72) Inventors: Feng-Ming Chang, Hsinchu County (TW); Lien-Jung Hung, Taipei (TW); Huai-Ying Huang, New Taipei (TW); Ping-Wei Wang, Hsinchu (TW)

(73) Assignee: Taiwan Semiconductor Manufacturing Company Limited, Hsinchu (TW)

(*) Notice: Subject to any disclaimer, the term of this patent is extended or adjusted under 35 U.S.C. 154(b) by 57 days.

(21) Appl. No.: 15/232,940

(22) Filed: Aug. 10, 2016

(65) Prior Publication Data
US 2016/0351574 A1    Dec. 1, 2016

Related U.S. Application Data

(62) Division of application No. 14/334,753, filed on Jul. 18, 2014, now Pat. No. 9,425,085.

(60) Provisional application No. 61/988,339, filed on May 5, 2014.

(51) Int. Cl.
| | |
|---|---|
| *H01L 21/768* | (2006.01) |
| *H01L 27/11* | (2006.01) |
| *H01L 23/528* | (2006.01) |
| *H01L 27/02* | (2006.01) |

(52) U.S. Cl.
CPC ........ *H01L 27/1104* (2013.01); *H01L 21/768* (2013.01); *H01L 21/76877* (2013.01); *H01L 21/76895* (2013.01); *H01L 23/528* (2013.01); *H01L 27/0207* (2013.01); *H01L 27/11* (2013.01); *H01L 2924/0002* (2013.01)

(58) Field of Classification Search
CPC ..................... H01L 27/11578; H01L 27/0688
USPC .............. 257/773, 333; 438/622; 365/63, 51
See application file for complete search history.

(56) References Cited

U.S. PATENT DOCUMENTS

| | | | | |
|---|---|---|---|---|
| 5,371,699 | A | * | 12/1994 | Larson .................... G11C 11/22 257/295 |
| 5,898,194 | A | * | 4/1999 | Gheewala ........... H01L 27/0207 257/204 |
| 2010/0177545 | A1 | * | 7/2010 | Liaw ..................... G11C 11/412 365/51 |
| 2010/0232210 | A1 | | 9/2010 | Kajiyama et al. |

(Continued)

FOREIGN PATENT DOCUMENTS

CN          103310833       *  9/2013

OTHER PUBLICATIONS

Chinese Office Action; Application No. 201410509519.2; dated Jul. 25, 2017.

*Primary Examiner* — Tuan Nguyen
(74) *Attorney, Agent, or Firm* — Jones Day

(57) ABSTRACT

Structures, devices and methods are provided for fabricating memory devices. A structure includes: a first conductive line disposed in a first conductive layer; a first landing pad disposed in the first conductive layer and associated with a second conductive line disposed in a second conductive layer; and a second landing pad disposed in the first conductive layer and associated with a third conductive line disposed in a third conductive layer. The second conductive layer and the third conductive layer are different from the first conductive layer.

20 Claims, 9 Drawing Sheets

(56) References Cited

U.S. PATENT DOCUMENTS

| | | | |
|---|---|---|---|
| 2010/0246234 A1* | 9/2010 | Ahn | G11C 5/02 |
| | | | 365/51 |
| 2011/0140070 A1* | 6/2011 | Kim | G11C 5/02 |
| | | | 257/5 |
| 2011/0304994 A1* | 12/2011 | Mair | H01L 23/5226 |
| | | | 361/748 |
| 2012/0235240 A1* | 9/2012 | Dixit | H01L 21/845 |
| | | | 257/351 |
| 2013/0020707 A1 | 1/2013 | Or-Bach et al. | |
| 2013/0235640 A1* | 9/2013 | Liaw | G11C 11/412 |
| | | | 365/63 |

\* cited by examiner

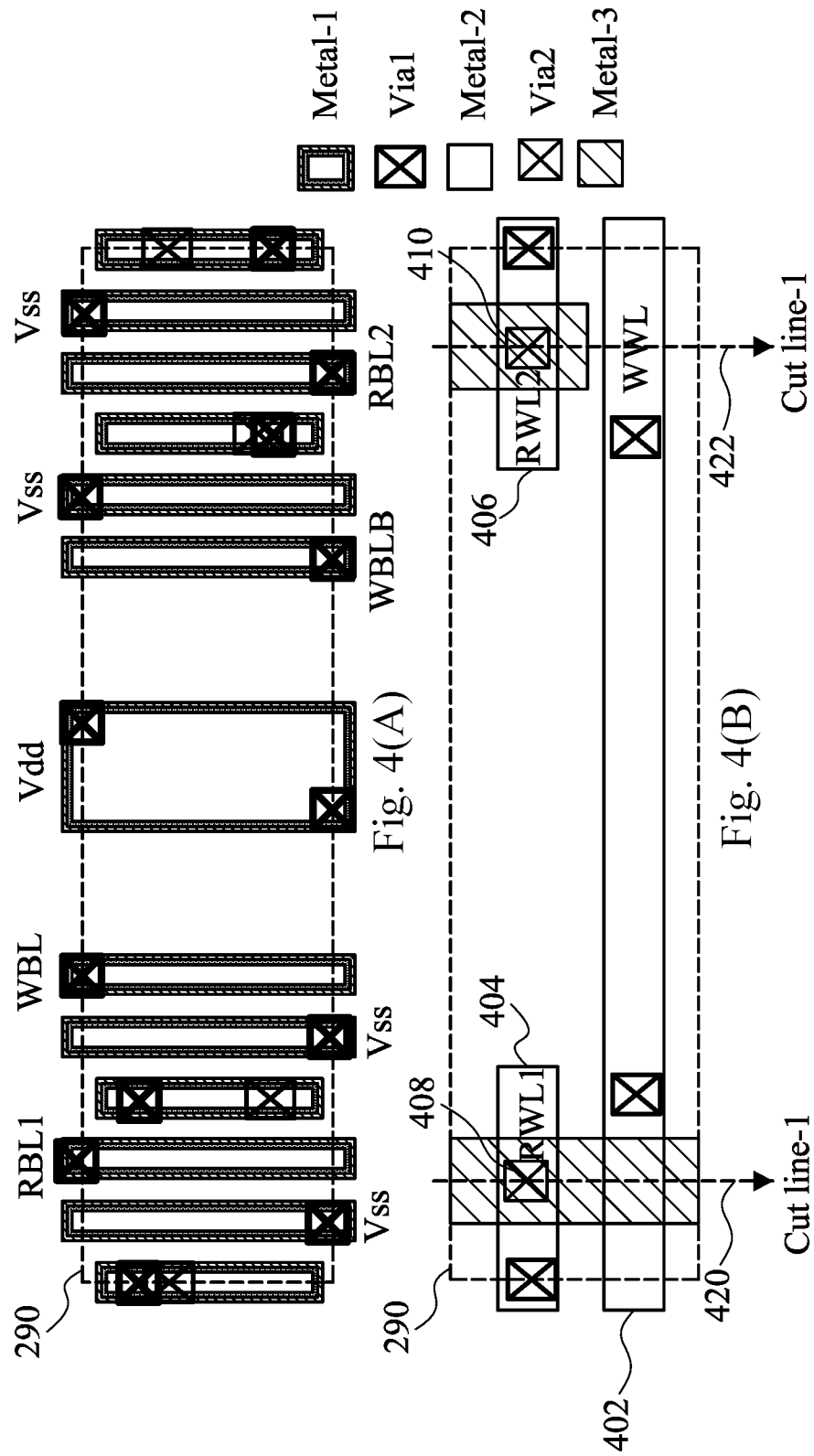

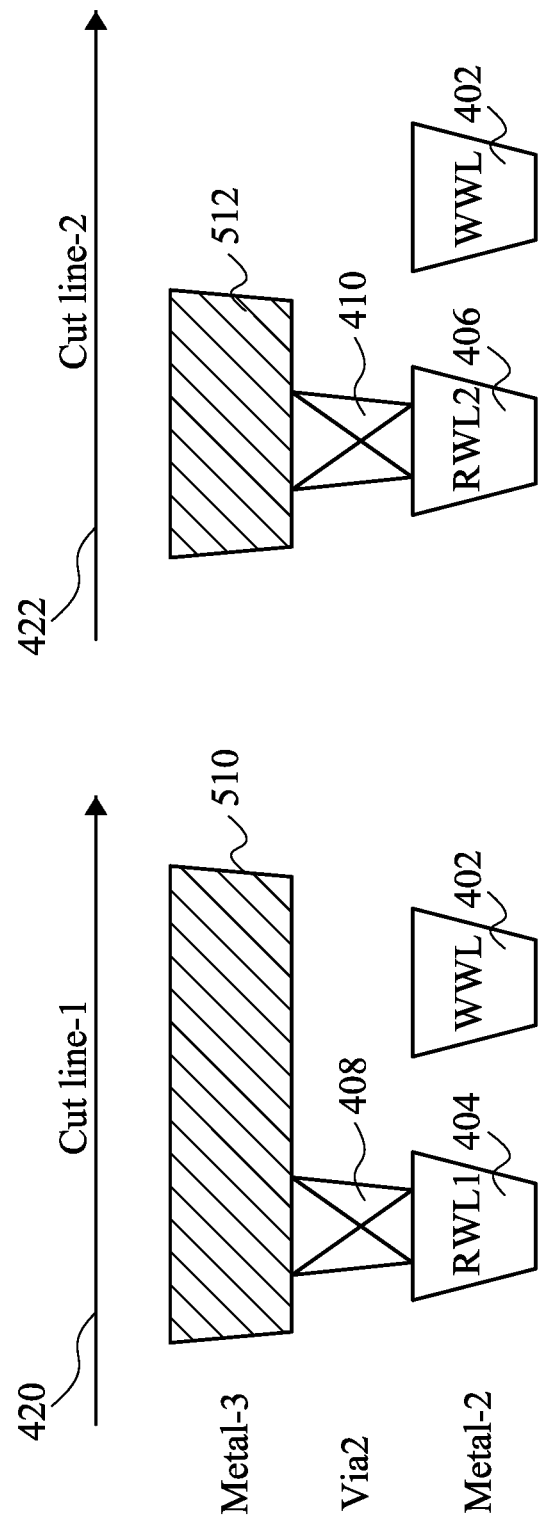

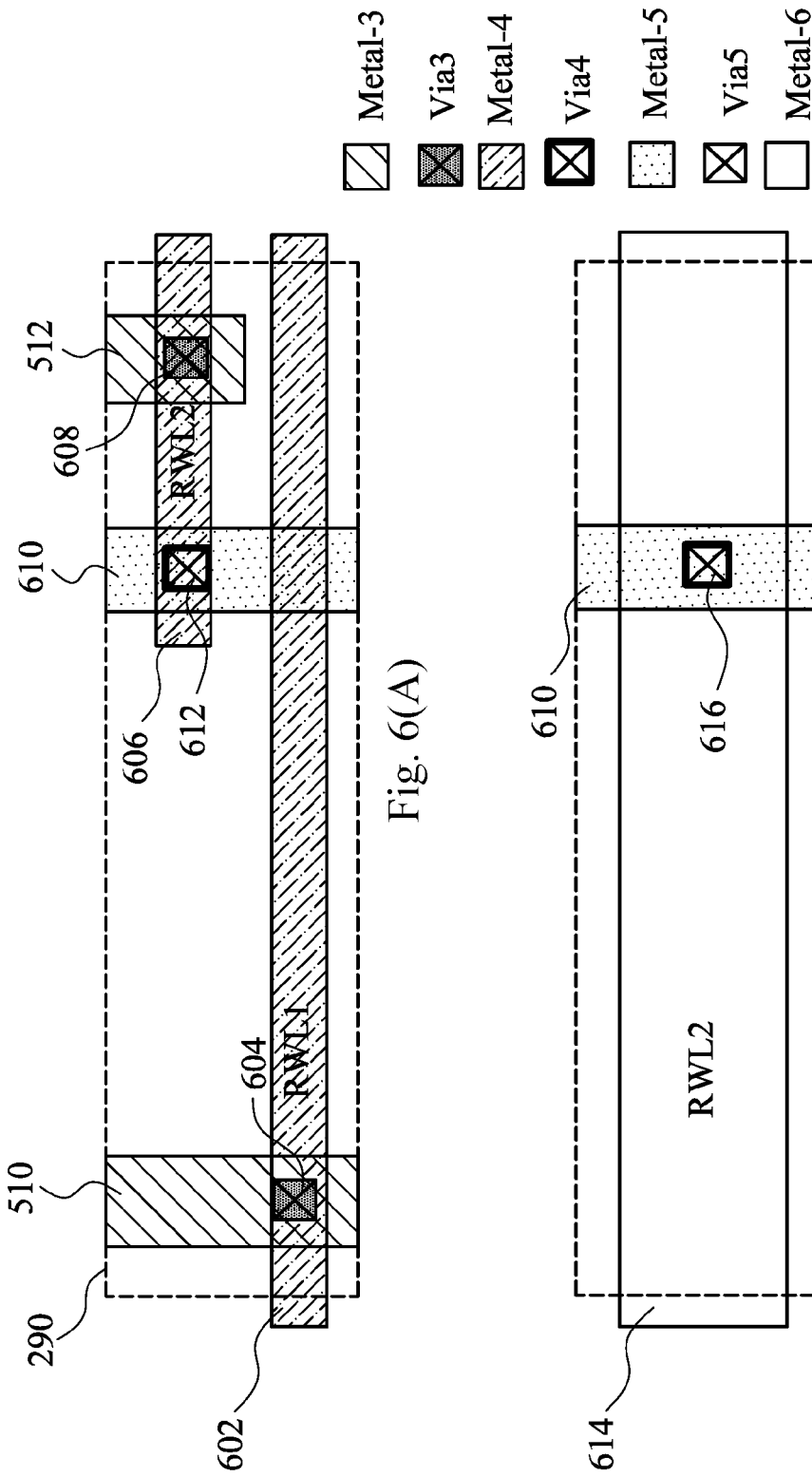

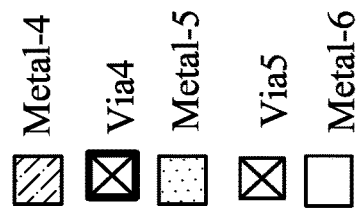
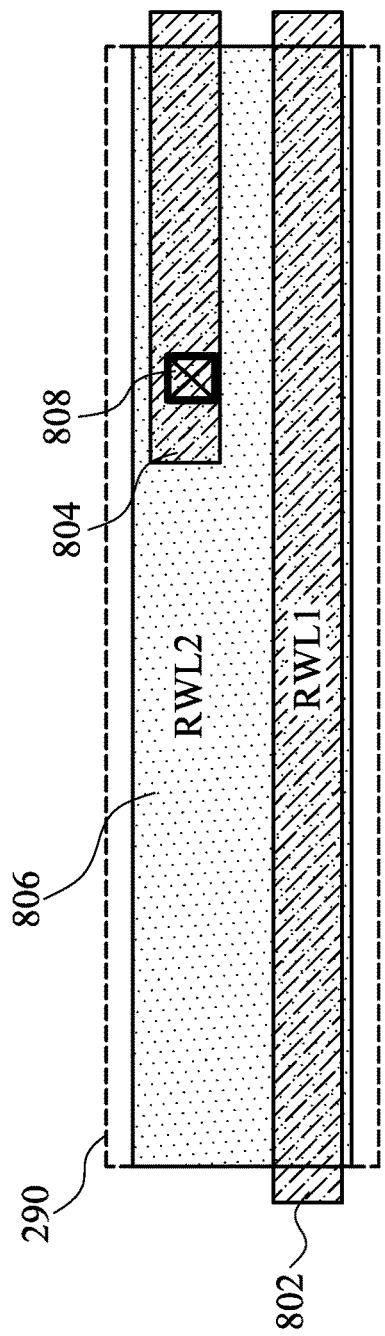
Fig. 8(A)
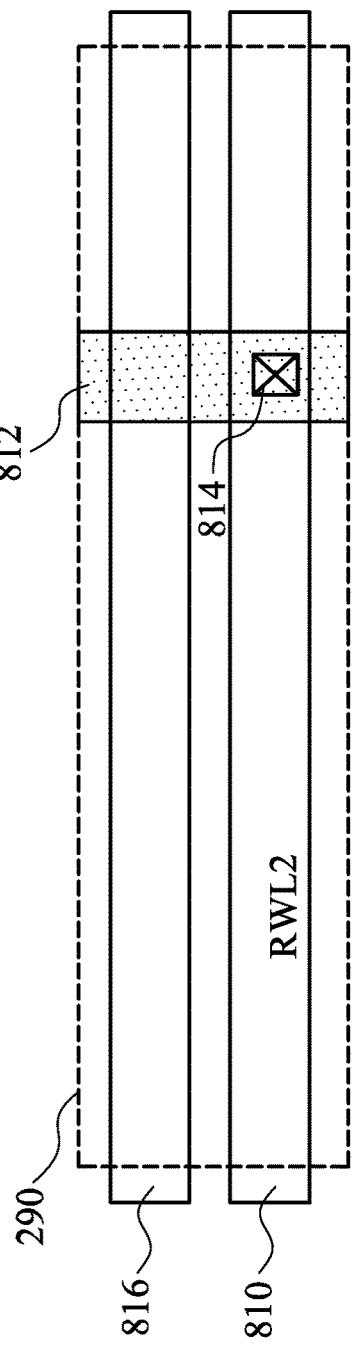
Fig. 8(B)

STRUCTURES, DEVICES AND METHODS FOR MEMORY DEVICES

PRIORITY CLAIM AND CROSS-REFERENCE

This disclosure is a divisional application of U.S. application Ser. No. 14/334,753, filed Jul. 18, 2014, which claims priority to and benefit from U.S. Provisional Patent Application No. 61/988,339, filed on May 5, 2014. These applications are herein incorporated herein by reference, in their entirety.

BACKGROUND

The technology described in this disclosure relates generally to semiconductor devices and more particularly to fabrication of semiconductor devices.

Static random access memory (SRAM) devices are used for various applications where high speed, low power consumption and simple operations are needed. A SRAM device often includes a number of memory cells, and each cell may contain multiple components, such as transistors, active areas of the transistors, conductive lines (e.g., word lines, bit lines), inter-layer connection structures (e.g., vias) and contacts. A SRAM cell often contains a pair of invertors arranged as a latch cell for data storage.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4(A) and FIG. 4(B) depict other example back end of line (BEOL) layout diagrams related to the SRAM cell as shown in FIG. 1, in accordance with some embodiments.

FIG. 5(A) and FIG. 5(B) depict example diagrams showing cross-sectional views associated with the layout diagrams as shown in FIG. 4(B), in accordance with some embodiments.

FIG. 6(A) and FIG. 6(B) depict example back end of line (BEOL) layout diagrams related to the layout diagrams as shown in FIG. 4(A) and FIG. 4(B), in accordance with some embodiments.

FIG. 8(A) and FIG. 8(B) depict other example back end of line (BEOL) layout diagrams related to the layout diagrams as shown in FIG. 4(A) and FIG. 4(B), in accordance with some embodiments.

DETAILED DESCRIPTION

Figure 1:
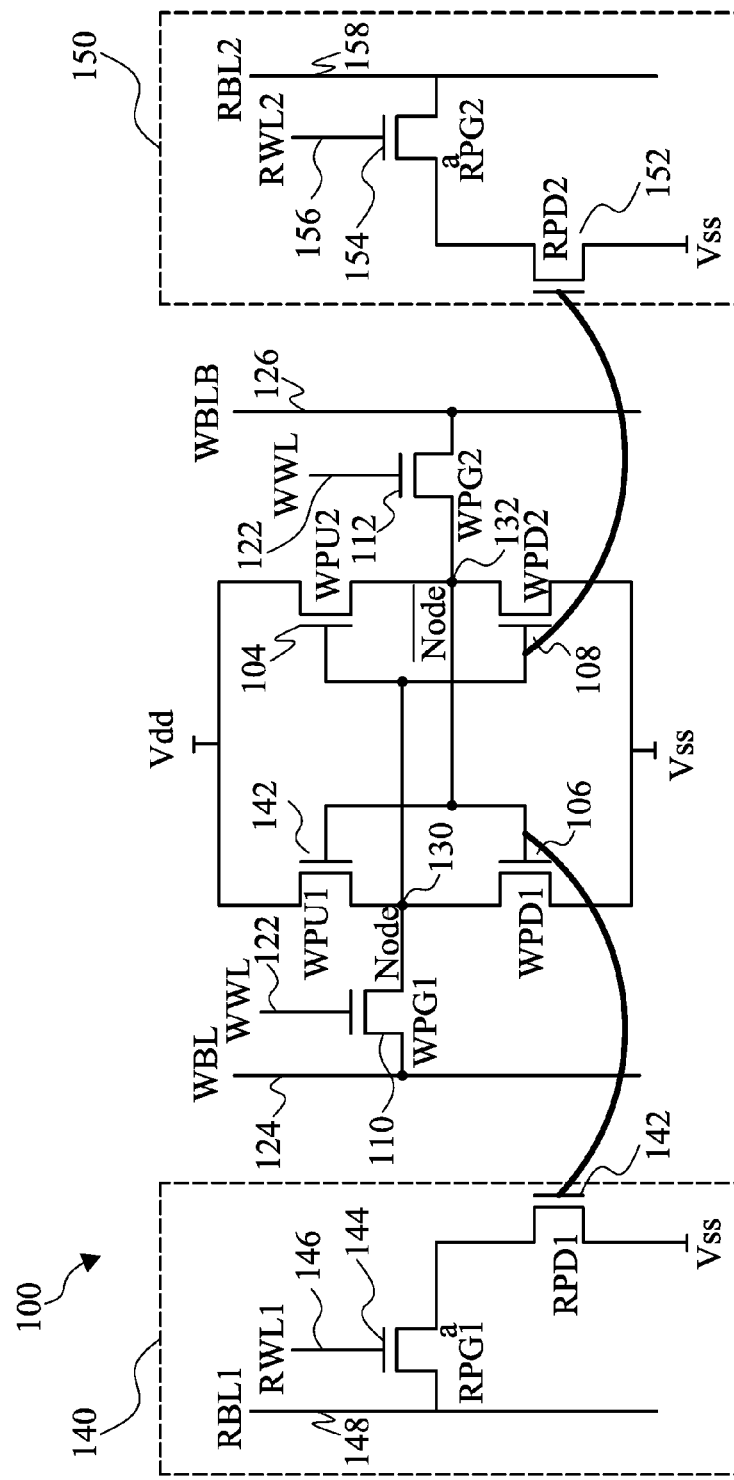
FIG. 1 depicts an example diagram of a ten-transistor (10-T) SRAM cell, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "in," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As feature sizes of semiconductor devices continue to shrink, various problems may emerge in device fabrication. For SRAM devices, as the memory cell size becomes smaller, individual components in the memory cell, such as conductive lines (e.g., word lines, bit lines), inter-layer connection structures (e.g., vias) and contacts, would naturally need to become smaller. However, for a particular cell layout, the size reduction of cell components (e.g., conductive lines, contacts) may cause certain problems, such as high resistance and high parasitic capacitance.

FIG. 1 depicts an example diagram of a ten-transistor (10-T) SRAM cell, in accordance with some embodiments. As shown in FIG. 1, the SRAM cell 100 includes two pull-up transistors 102 ("WPU1") and 104 ("WPU2"), two pull-down transistors 106 ("WPD1") and 108 ("WPD2"), and two pass-gate transistors 110 ("WPG1") and 112 ("WPG2"). The transistors 102, 104, 106 and 108 are connected in cross-coupled inverter configuration. That is, the transistors 102 and 106 form a first inverter, and the transistors 104 and 108 form a second inverter. Gate terminals of the pass-gate transistors 110 and 112 are both configured to respond to a word-line signal associated with a word line 122 ("WWL"). A pair of complementary bit lines 124 ("WBL") and 126 ("WBLB") are coupled to source/drain regions of the pass-gate transistors 110 and 112 respectively. The pass-gate transistors 110 is coupled to the pull-up transistor 102 and the pull-down transistor 106 at a node 130, and the pass-gate transistors 112 is coupled to the pull-up transistor 104 and the pull-down transistor 108 at another node 132. For example, the pull-up transistors 102 and 104 are P-channel transistors, and the pull-down transistors 106 and 108 are N-channel transistors. The pass-gate transistors 110 and 112 are N-channel transistors.

A first read port 140 includes a read port pull down transistor 142 ("RPD1") and a read port pass gate transistor 144 ("RPG1"). A gate terminal of the read port pull down transistor 142 ("RPD1") is coupled to the node 132. For example, the transistors 142 and 144 are N-channel transistors. A read word line 146 (RWL1) is provided and dedicated to "read" operations, and the word line 122 ("WWL") is dedicated to "write" operations. A read bit line 148 ("RBL1") is coupled to the read pass gate transistor 144 ("RPG1").

A second read port 150 includes a read port pull down transistor 152 ("RPD2") and a read port pass gate transistor 154 ("RPG2"). A gate terminal of the read port pull down transistor 152 ("RPD2") is coupled to the node 130. For example, the transistors 152 and 154 are N-channel transistors. A read word line 156 (RWL2) is provided and dedicated to "read" operations, and a read bit line 158 ("RBL2") is coupled to the read pass gate transistor 154 ("RPG2").

Figure 2:
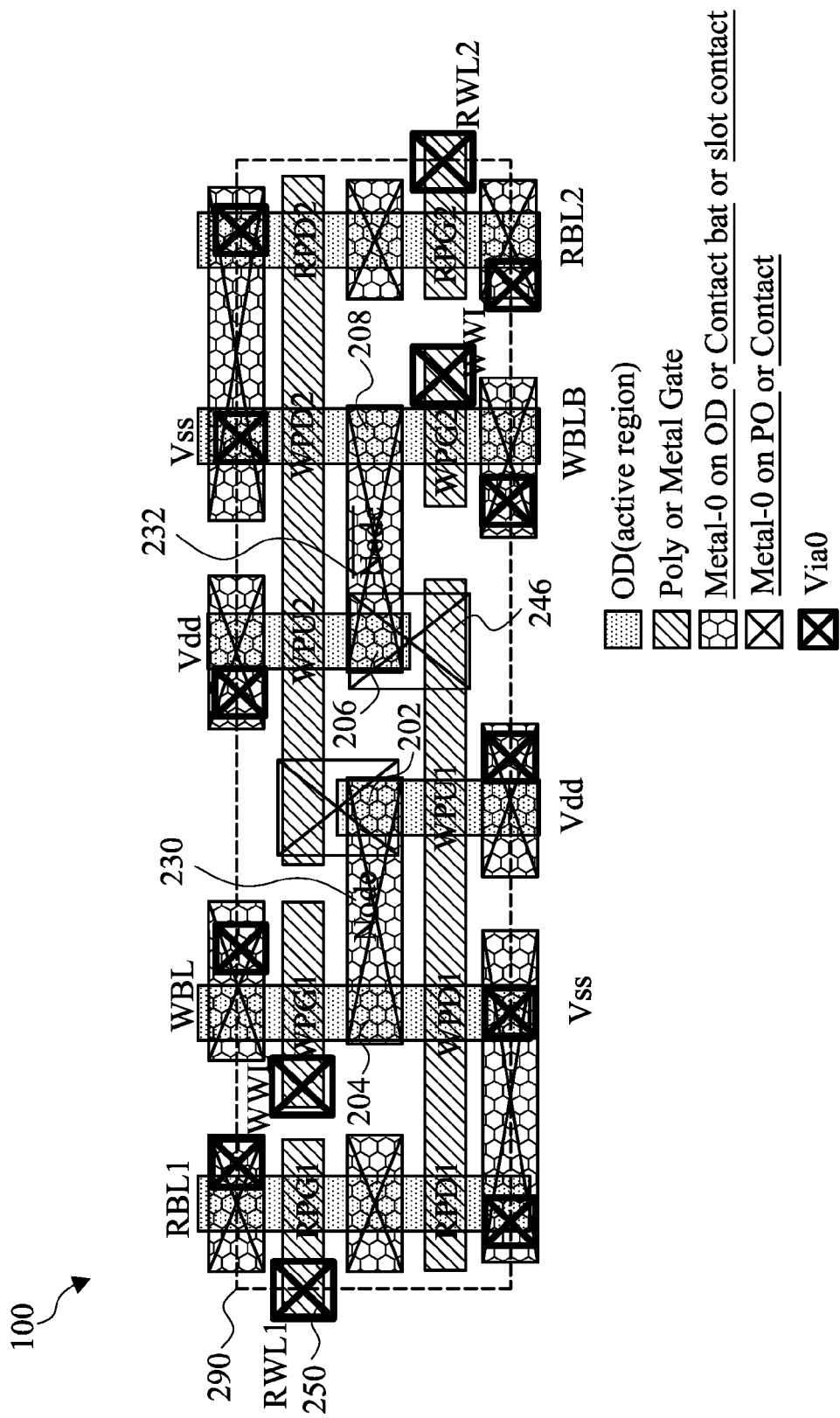
FIG. 2 depicts an example front end of line (FEOL) layout diagram of the SRAM cell as shown in FIG. 1, in accordance with some embodiments.

FIG. 2 depicts an example front end of line (FEOL) layout diagram of the SRAM cell as shown in FIG. 1, in accordance with some embodiments. As shown in FIG. 2, the transistors 102, 104, 106 and 108 are interconnected (e.g., through metal contacts, contact bars, or slot contacts). A source/drain region 202 of the transistor 102 ("WPU1") is connected to a source/drain region 204 of the transistor 106 ("WPD1") through a conduction structure 230 that corresponds to the node 130. A source/drain region 206 of the transistor 104 ("WPU2") is connected to a source/drain region 208 of the transistor 108 ("WPD2") through a conduction structure 232 that corresponds to the node 132.

As shown in FIG. 2, active regions ("OD") are formed between isolation regions (e.g., shallow trench isolation or LOCOS isolation). For example, the active regions include diffusions that extend into a semiconductor substrate. In some embodiments, the active regions are doped to form n-type regions or p-type regions and lightly doped drain regions. The active regions may also contain additional implants to form source and drain regions. In certain embodiments, the active regions are formed in a surface region of a semiconductor wafer or in a layer of silicon epitaxially formed over an insulator (SOI).

The transistors in the SRAM cell 100 are formed in a bit cell area (e.g., related to a bit cell boundary 290) using conductive materials (e.g., polysilicon or metal materials) deposited and patterned over dielectric materials overlying the active regions. The transistors are interconnected using certain conductive materials (e.g., "Poly or Metal Gate") to couple common gate terminals together. The active regions ("OD") form the source and drain regions of the transistors, and some source/drain regions of the transistors are interconnected using some conductive materials (e.g., "Metal-0 on OD or Contact Bar or Slot Contact"). Additionally, certain gate terminals (e.g., a gate terminal 246) are connected to source/drain regions (e.g., the source/drain region 206) using certain conductive materials (e.g., "Metal-0 on PO or Contact"). Inter-layer connection structures (e.g., "Via0") are formed using conductive materials to connect the transistors to conductive routing lines in one or more conductive layers that are formed during back end of line (BEOL) processes.

Figures 3A, 3B:
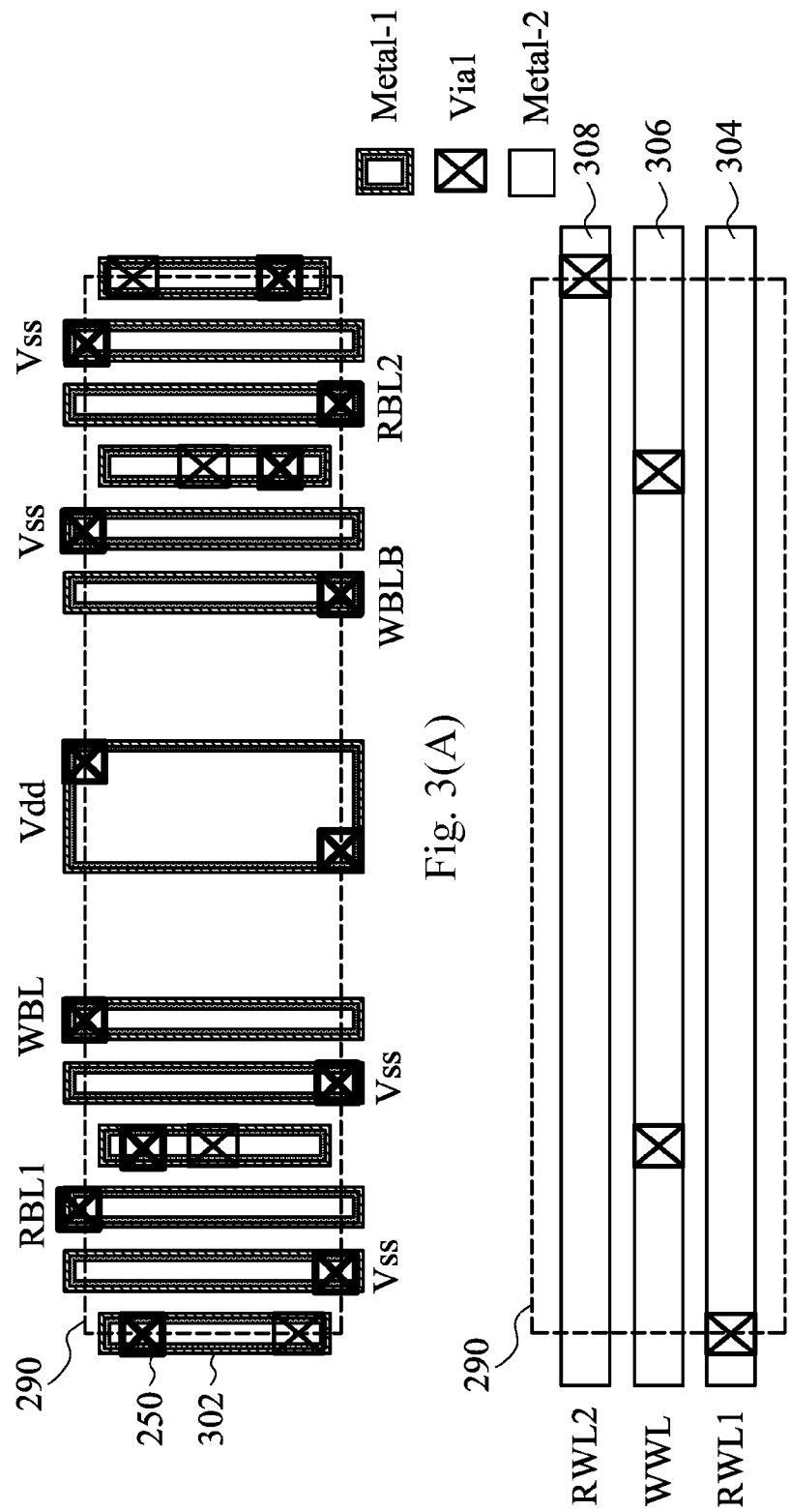
FIG. 3(A) and FIG. 3(B) depict example back end of line (BEOL) layout diagrams related to the SRAM cell as shown in FIG. 1, in accordance with some embodiments.

FIG. 3(A) and FIG. 3(B) depict example back end of line (BEOL) layout diagrams related to the SRAM cell as shown in FIG. 1, in accordance with some embodiments. As shown in FIG. 3(A), a conductive layer ("Metal-1") that includes one or more conductive lines/blocks is formed to connect to the inter-layer connection structures (e.g., "Via0") that are formed during the FEOL processes. For example, the conductive line 302 in the conductive layer ("Metal-1") is connected to an inter-layer connection structure 250 that is associated with the read word line 146 (RWL1).

As shown in FIG. 3(B), three conductive lines 304, 306, and 308 are formed in another conductive layer ("Metal-2") in parallel, and are associated with the read word line 146 (RWL1), the word line 122 ("WWL"), and the read word line 156 (RWL2), respectively. The conductive lines 304, 306, and 308 are connected to the conductive layer ("Metal-1") through one or more inter-layer connection structures ("Via1"). For example, the inter-layer connection structures (e.g., "Via1") include metal-containing materials.

To further reduce resistance and capacitance (e.g., associated with the word lines), different BEOL layouts can be implemented. FIG. 4(A) and FIG. 4(B) depict other example back end of line (BEOL) layout diagrams related to the SRAM cell as shown in FIG. 1, in accordance with some embodiments. As shown in FIG. 4(A) and FIG. 4(B), a conductive line 402 that is associated with the word line 122 ("WWL") is formed in the conductive layer ("Metal-2"). Two conductive landing pads (or islands) 404 and 406 are formed in the conductive layer ("Metal-2") for the read word line 146 (RWL1) and the read word line 156 (RWL2), respectively. Inter-layer connection structures 408 and 410 ("Via2") are formed to connect the conductive landing pads (or islands) 404 and 406 to one or more conductive layers ("Metal-3") formed in subsequent BEOL processes. In some embodiments, the conductive line 402 extends along a length of the bit cell boundary 290. The conductive landing pads (or islands) 404 and 406 are formed on a same side of the conductive line 402 (e.g., along a same conductive track) and extend along the length of the bit cell boundary 290.

FIG. 5(A) and FIG. 5(B) depict example diagrams showing cross-sectional views associated with the layout diagrams as shown in FIG. 4(B), in accordance with some embodiments. Specifically, FIG. 5(A) shows a cross-sectional view along a cutline 420, and FIG. 5(B) shows a cross-sectional view along a cutline 422. As shown in FIG. 5(A) and FIG. 5(B), the conductive landing pads (or islands) 404 and 406 are connected to the conductive lines/blocks 510 and 512 in the conductive layer ("Metal-3") through the inter-layer connection structures 408 and 410 ("Via2") respectively.

FIG. 6(A) and FIG. 6(B) depict example back end of line (BEOL) layout diagrams related to the layout diagrams as shown in FIG. 4(A) and FIG. 4(B), in accordance with some embodiments. As shown in FIG. 6(A), a conductive line 602 associated with the read word line 146 (RWL1) is formed in a conductive layer ("Metal-4") and is connected to the conductive line/block 510 through an inter-layer connection structure 604. A conductive landing pad (or island) 606 associated with the read word line 156 (RWL2) is formed in the conductive layer ("Metal-4") and is connected to the conductive line/block 512 through an inter-layer connection structure 608. A conductive line/block 610 is formed in a conductive layer ("Metal-5") and is connected to the landing pad (or island) 606 through an inter-layer connection structure 612. As shown in FIG. 6(B), a conductive line 614 associated with the read word line 156 (RWL2) is formed in a conductive layer ("Metal-6") and is connected to the conductive line/block 610 through an inter-layer connection structure 616. As such, the word line 122 ("WWL"), the read word line 146 (RWL1) and the read word line 156 (RWL2) correspond to three conductive lines in three different conductive layers, so as to reduce resistance and capacitance associated with these word lines.

Figures 7A, 7B:
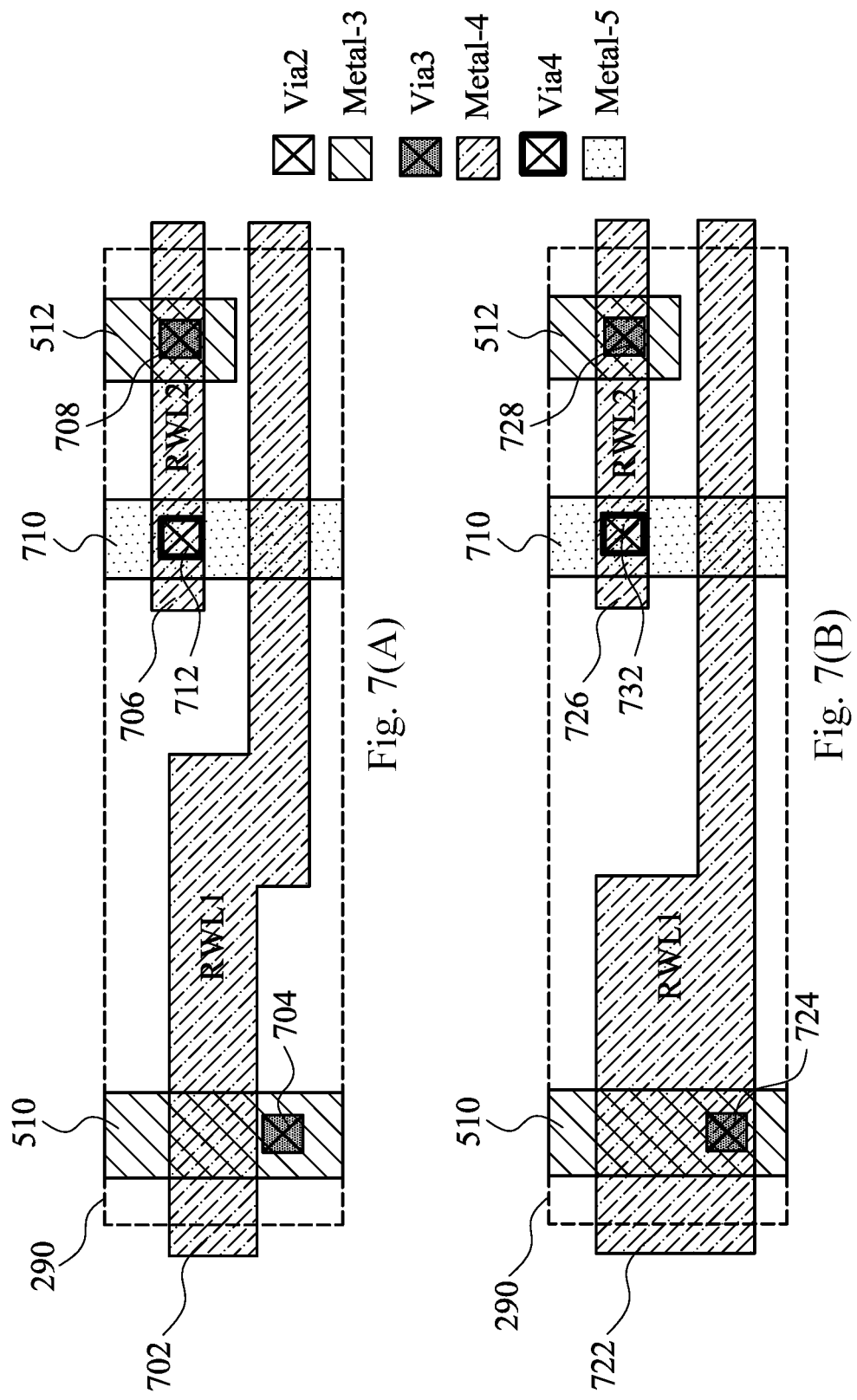
FIG. 7(A) and FIG. 7(B) depict other example back end of line (BEOL) layout diagrams related to the layout diagrams as shown in FIG. 4(A) and FIG. 4(B), in accordance with some embodiments.

FIG. 7(A) and FIG. 7(B) depict other example back end of line (BEOL) layout diagrams related to the layout diagrams as shown in FIG. 4(A) and FIG. 4(B), in accordance with some embodiments. A conductive line associated with the read word line 146 (RWL1) may be formed into different shapes. As shown in FIG. 7(A), a conductive line 702 associated with the read word line 146 (RWL1) is formed in a conductive layer ("Metal-4") and is connected to the conductive line/block 510 through an inter-layer connection structure 704. For example, the conductive line 702 has a zigzag shape. A conductive landing pad (or island) 706 associated with the read word line 156 (RWL2) is formed in the conductive layer ("Metal-4") and is connected to the conductive line/block 512 through an inter-layer connection structure 708. A conductive line/block 710 is formed in a conductive layer ("Metal-5") and is connected to the landing pad (or island) 706 through an inter-layer connection structure 712.

Alternatively, as shown in FIG. 7(B), a conductive line 722 associated with the read word line 146 (RWL1) is formed in a conductive layer ("Metal-4") and is connected to the conductive line/block 510 through an inter-layer connection structure 724. A conductive landing pad (or island) 726 associated with the read word line 156 (RWL2) is formed in the conductive layer ("Metal-4") and is connected to the conductive line/block 512 through an inter-layer connection structure 728. A conductive line/block 730 is formed in a conductive layer ("Metal-5") and is connected to the landing pad (or island) 726 through an inter-layer connection structure 732.

FIG. 8(A) and FIG. 8(B) depict other example back end of line (BEOL) layout diagrams related to the layout diagrams as shown in FIG. 4(A) and FIG. 4(B), in accordance with some embodiments. As shown in FIG. 8(A), a conductive line 802 associated with the read word line 146 (RWL1) is formed in a conductive layer ("Metal-4"), and a conductive landing pad (or island) 804 associated with the read word line 156 (RWL2) is formed in the conductive layer ("Metal-4"). A conductive block 806 is formed in a conductive layer ("Metal-5") and is connected to the landing pad (or island) 804 through an inter-layer connection structure 808.

Alternatively, as shown in FIG. 8(B), a conductive line 810 associated with the read word line 156 (RWL2) is formed in a conductive layer ("Metal-6") and is connected to a conductive line/block 812 that is formed in the conductive layer ("Metal-5") through an inter-layer connection structure 814. Another conductive line 816 is added beside the conductive line 810 in the conductive layer ("Metal-6").

Figure 9:
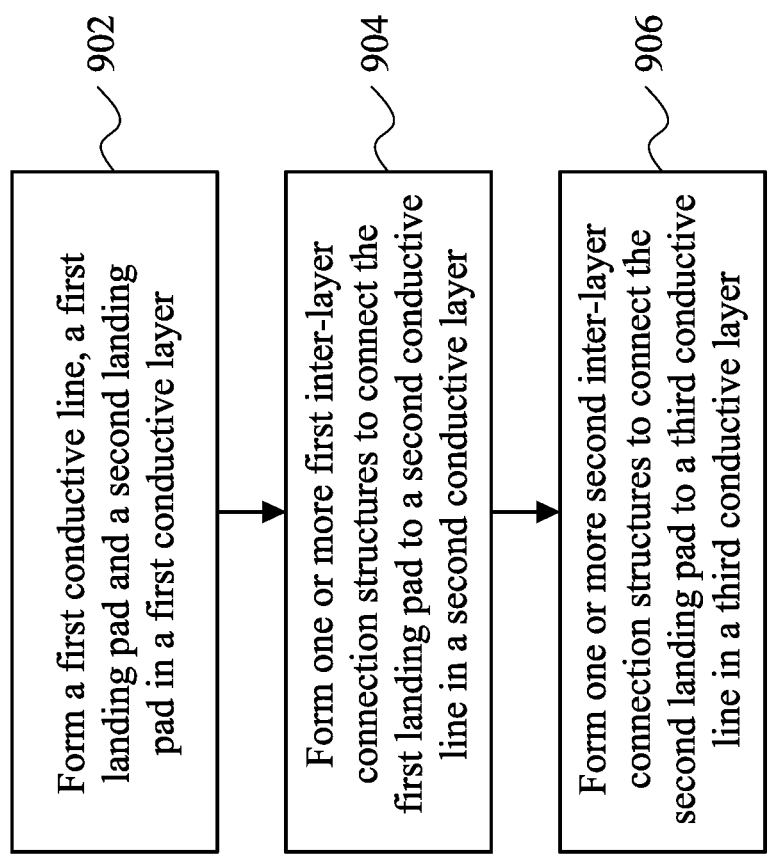
FIG. 9 depicts an example flow chart for fabricating memory devices, in accordance with some embodiments.

FIG. 9 depicts an example flow chart for fabricating memory devices, in accordance with some embodiments. At 902, a first conductive line, a first landing pad and a second landing pad are formed in a first conductive layer. At 904, one or more first inter-layer connection structures are formed to connect the first landing pad to a second conductive line in a second conductive layer. At 906, one or more second inter-layer connection structures are formed to connect the second landing pad to a third conductive line in a third conductive layer. The second conductive layer and the third conductive layer are different from the first conductive layer.

According to one embodiment, a structure is provided for fabricating a memory device. The structure includes: a first conductive line disposed in a first conductive layer, a first landing pad disposed in the first conductive layer and associated with a second conductive line disposed in a second conductive layer, and a second landing pad disposed in the first conductive layer and associated with a third conductive line disposed in a third conductive layer. The second conductive layer and the third conductive layer are different from the first conductive layer.

According to another embodiment, a static random access memory (SRAM) device includes: a first word line disposed in a first conductive layer, a second word line disposed in a second conductive layer and associated with a first landing pad disposed in the first conductive layer, and a third word line disposed in a third conductive layer and associated with a second landing pad disposed in the first conductive layer. The second conductive layer and the third conductive layer are different from the first conductive layer.

According to yet another embodiment, a method is provided for fabricating a memory device. A first conductive line, a first landing pad and a second landing pad are formed in a first conductive layer. One or more first inter-layer connection structures are formed to connect the first landing pad to a second conductive line in a second conductive layer. One or more second inter-layer connection structures are formed to connect the second landing pad to a third conductive line in a third conductive layer. The second conductive layer and the third conductive layer are different from the first conductive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a 3-port memory device comprising at least one memory cell, the method comprising:
   forming first, second, and third conductive layers;
   forming a first word line associated with a first memory cell, a first landing pad and a second landing pad in the first conductive layer;
   forming one or more first inter-layer connection structures to couple the first landing pad to a second word line associated with the first memory cell in the second conductive layer;
   forming one or more second inter-layer connection structures to couple the second landing pad to a third word line associated with the first memory cell in the third conductive layer; and
   coupling a memory cell to the first word line, the second word line and the third word line;
   wherein the second conductive layer and the third conductive layer are different from the first conductive layer.

2. The method of claim 1, wherein the memory device is a static random access memory (SRAM) device.

3. The method of claim 1, wherein the memory cell is coupled to the second word line through the first landing pad and third word line through the second landing pad.

4. The method of claim 1, wherein at least two of the first conductive layer, the second conductive layer, and the third conductive layer are disposed one above the other.

5. The method of claim 1, wherein the first word line corresponds to a write word line.

6. The method of claim 1, wherein the second word line corresponds to a first read word line.

7. The method of claim 1, wherein the third word line corresponds to a second read word line.

8. The method of claim 1, wherein:
   the first conductive layer is associated with a first height relative to a substrate;

the second conductive layer is associated with a second height relative to the substrate; and the second height is larger than the first height.

9. The method of claim 1, wherein:
the first conductive layer is associated with a first height relative to a substrate;
the third conductive layer is associated with a second height relative to the substrate; and
the second height is larger than the first height.

10. The method of claim 1, wherein:
the first word line extends along a first direction;
the first landing pad extends along the first direction; and
the second landing pad extends along the first direction.

11. The method of claim 1, wherein the first landing pad is coupled to the second word line disposed in the second conductive layer through a first inter-layer connection structure.

12. The method of claim 1, wherein:
the second landing pad is coupled to a third landing pad in the second conductive layer through a second inter-layer connection structure; and
the third landing pad is coupled to the third conductive line disposed in the third conductive layer through a third inter-layer connection structure.

13. The method of claim 1, wherein:
the second landing pad is coupled to a third landing pad in the second conductive layer through a second inter-layer connection structure;
the third landing pad is coupled to a fourth landing pad in a fourth conductive layer through a third inter-layer connection structure; and
the fourth landing pad is coupled to the third conductive line disposed in the third conductive layer through a fourth inter-layer connection structure.

14. The method of claim 1, wherein the first landing pad and the second landing pad are disposed on a same side of the first word line.

15. A method for fabricating a 3-port static random access memory (SRAM) memory device comprising at least one memory cell, the method comprising:
forming first, second, and third conductive layers;
forming a write word line associated with a first memory cell, a first landing pad and a second landing pad in the first conductive layer;
forming one or more first inter-layer connection structures to couple the first landing pad to a first read word line associated with the first memory cell in the second conductive layer;
forming one or more second inter-layer connection structures to couple the second landing pad to a second read word line associated with the first memory cell in the third conductive layer; and
coupling an SRAM cell to the write word line and the first and second landing pads;
wherein the second conductive layer and the third conductive layer are different from the first conductive layer.

16. The method of claim 15, wherein at least two of the first conductive layer, the second conductive layer, and the third conductive layer are disposed one above the other.

17. The method of claim 15, wherein:
the first conductive layer is associated with a first height relative to a substrate;
the second conductive layer is associated with a second height relative to the substrate; and
the second height is larger than the first height.

18. The method of claim 15, wherein:
the first conductive layer is associated with a first height relative to a substrate;
the third conductive layer is associated with a second height relative to the substrate; and
the second height is larger than the first height.

19. The method of claim 15, wherein the first landing pad is coupled to the first read word line disposed in the second conductive layer through a first inter-layer connection structure.

20. A structure for fabricating a memory device comprising at least one memory cell, the structure comprising:
a first word line associated with a first memory cell and disposed in a first conductive layer;
a first landing pad disposed in the first conductive layer and associated with a second word line associated with the first memory cell and disposed in a second conductive layer;
a second landing pad disposed in the first conductive layer and associated with a third word line associated with the first memory cell and disposed in a third conductive layer; and
a memory cell associated with the first word line, the second word line and the third word line;
wherein the second conductive layer and the third conductive layer are different from the first conductive layer.

* * * * *